United States Patent
Blonigan et al.

(10) Patent No.: US 8,365,682 B2
(45) Date of Patent: Feb. 5, 2013

(54) METHODS AND APPARATUS FOR SUPPORTING SUBSTRATES

(75) Inventors: Wendell T. Blonigan, Pleasanton, CA (US); Carl Sorensen, Morgan Hill, CA (US); John M. White, Hayward, CA (US); Robin L. Tiner, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1373 days.

(21) Appl. No.: 11/140,777

(22) Filed: May 31, 2005

(65) Prior Publication Data
US 2005/0265818 A1 Dec. 1, 2005

Related U.S. Application Data

(60) Provisional application No. 60/575,869, filed on Jun. 1, 2004, provisional application No. 60/587,294, filed on Jul. 12, 2004.

(51) Int. Cl.
B65G 49/07 (2006.01)
(52) U.S. Cl. ......... 118/500; 118/729; 414/672; 414/935
(58) Field of Classification Search .................... 414/672
See application file for complete search history.

(56) References Cited

U.S. PATENT DOCUMENTS

| | | | | |
|---|---|---|---|---|
| 3,890,710 A * | 6/1975 | Jaeger | | 433/50 |
| 4,790,258 A | 12/1988 | Drage et al. | | |
| 5,820,685 A * | 10/1998 | Kurihara et al. | | 118/729 |
| 5,848,670 A * | 12/1998 | Salzman | | 187/272 |
| 5,879,128 A * | 3/1999 | Tietz et al. | | 414/757 |
| 6,104,002 A * | 8/2000 | Hirose et al. | | 219/390 |
| 6,109,922 A * | 8/2000 | Litschel et al. | | 434/114 |
| 6,149,365 A * | 11/2000 | White et al. | | 414/217 |
| 6,190,113 B1 * | 2/2001 | Bui et al. | | 414/672 |
| 6,419,438 B1 | 7/2002 | Rosenquist | | |
| 6,676,759 B1 * | 1/2004 | Takagi | | 118/728 |
| 6,887,317 B2 * | 5/2005 | Or et al. | | 118/728 |
| 7,214,271 B2 * | 5/2007 | Kono et al. | | 117/223 |
| 2002/0011204 A1 * | 1/2002 | Gujer et al. | | 118/500 |
| 2003/0136341 A1 * | 7/2003 | Na | | 118/500 |
| 2003/0178145 A1 * | 9/2003 | Anderson et al. | | 156/345.51 |
| 2004/0045509 A1 * | 3/2004 | Or et al. | | 118/729 |
| 2007/0160507 A1 * | 7/2007 | Satoh et al. | | 422/135 |

FOREIGN PATENT DOCUMENTS

| | | |
|---|---|---|
| JP | 37-001367 | 2/1962 |
| JP | 52-121571 | 3/1976 |
| JP | 06-318630 | 11/1994 |
| JP | 08-316292 | 11/1996 |
| JP | 10-092916 | 4/1998 |
| JP | 2003-100855 | 4/2003 |
| JP | 2003-124297 | 4/2003 |
| JP | 2005-015574 | 1/2005 |
| JP | 2005-197380 | 7/2005 |
| KR | 2003-61557 | 7/2003 |
| WO | WO98/32571 | 7/1998 |

OTHER PUBLICATIONS

Office Action of Japanese Patent Application No. P2005-161844 issued on Apr. 1, 2008.

* cited by examiner

*Primary Examiner* — James Keenan
(74) *Attorney, Agent, or Firm* — Dugan & Dugan, PC

(57) ABSTRACT

Substrate support methods and apparatus include vertically aligned lift pins that have bearing surfaces that engage friction plates and/or magnetic fields to maintain the vertical orientation of the lift pins during substrate lifting. In some embodiments, a magnetic field and/or weighting may alternatively or additionally be used to control the vertical orientation of the lift pins, limit the angle of the lift pins, and/or prevent the lift pins from unintentionally binding in a susceptor as the susceptor is raised and prevent the resulting uneven support of the substrate.

9 Claims, 10 Drawing Sheets

METHODS AND APPARATUS FOR SUPPORTING SUBSTRATES

The present application claims priority to U.S. Provisional Patent Application Ser. No. 60/575,869, filed Jun. 1, 2004 and to U.S. Provisional Patent Application Ser. No. 60/587,294, filed Jul. 12, 2004, both of which are hereby incorporated by reference herein in their entirety for all purposes.

FIELD OF THE INVENTION

The present invention relates to methods and apparatus for handling substrates in flat panel display and/or electronic device processing systems. More specifically, the present invention relates to controlling lift pins used to raise substrates such as glass substrates, polymer substrates, semiconductor wafers, etc., off of a surface.

BACKGROUND

As depicted in FIG. 1, a prior art substrate support 100 includes a conventional vertical lift pin 102 that relies on a bushing 106 or collar mounted in a susceptor 104 to provide horizontal support near the top of the lift pin 102 to maintain the pin 102 in a vertical position and limit the angle that the pin 102 can vary from a vertical orientation. An intentionally low friction ceramic skid plate 110 is provided to contact the rounded bottom of the conventional lift pin 102. The conventional lift pin 102 itself typically has a smooth radius bearing surface 108 for contacting the skid plate 110. The ceramic skid plate 110 is mounted on an aluminum plug 112 that is inserted into an opening in the bottom wall 114 of a process chamber. The plug 112 includes an O-ring 116 to maintain the seal of the chamber. Thus, the bushing 106 provides the only horizontal force on the lift pin 102 to guide it as the pin 102 is raised or lowered. The lower end of the lift pin 102 is free to slip on the skid plate 110.

In operation, the susceptor 104 is lowered toward the bottom wall 114 of the chamber which causes the lower bearing surface 108 of multiple lift pins 102 to contact multiple skid plates 110. As the susceptor 104 is further lowered the lift pins rise relative to the susceptor 104 and lift the substrate (not pictured) off of the susceptor 104. Once the substrate has been lifted, a substrate blade (not pictured) such as an end effector may be inserted below the substrate to remove the substrate from the chamber.

In conventional substrate supports, as the bushing 106 wears from guiding the lift pin 102, play may develop in the horizontal position of the lift pin 102 and the bushing's ability to maintain a precise vertical orientation of the lift pin 102 may become compromised. In addition, the lift pin 102 may not travel smoothly through a worn bushing 106 which may affect substrate positioning. Further, the more surface area of a bushing that contacts a lift pin, the more likely it is that potentially contaminating particles may be generated.

An additional problem with conventional lift pins 102 is that they have a tendency to bind in the bushings 106 due to friction such that some lift pins 102 may remain raised above the top surface of the susceptor 104 even as the susceptor 104 is raised. This results in the substrate being lifted unevenly and, in some circumstances, the substrate may be damaged either by a bound lift pin 102 piercing the substrate or suddenly becoming unbound and dropping the substrate. Thus, what is needed is substrate lifting methods and apparatus that are not subject to such problems.

SUMMARY

In some embodiments, the present invention provides a substrate support with lift pins that do not rely solely on bushings to maintain the pins in a vertical orientation or to limit the angle of the pins as they travel. In some embodiments, the present invention uses friction applied at the lower end of the lift pins to maintain the vertical orientation of the lift pins. In some embodiments, the present invention uses magnetic force or a combination of friction and magnetic force to maintain the lift pins' orientation. The present invention applies friction and/or magnetic force to the lower bearing surface of the lift pins such that the lift pins are restricted from horizontal movement by both the friction and/or magnetic force applied at the bottom of the lift pins as well as by reduced contact area bushings at the top of the lift pins.

In some embodiments, a weight and/or a permanent magnet are used to prevent lift pins from binding in their bushings. As the susceptor is raised, the weight and/or permanent magnet attached to each lift pin pulls the lift pins through their bushings such that any binding friction is overcome by the force of the weight and/or permanent magnet and thus, the lift pins move smoothly through the susceptor.

Numerous other aspects are provided, as are systems and apparatus in accordance with these and other aspects of the invention. These and the other aspects and features of the present invention will be more fully understood with reference to the attached drawings and the following detailed description.

DRAWINGS

DETAILED DESCRIPTION

Figure 1:
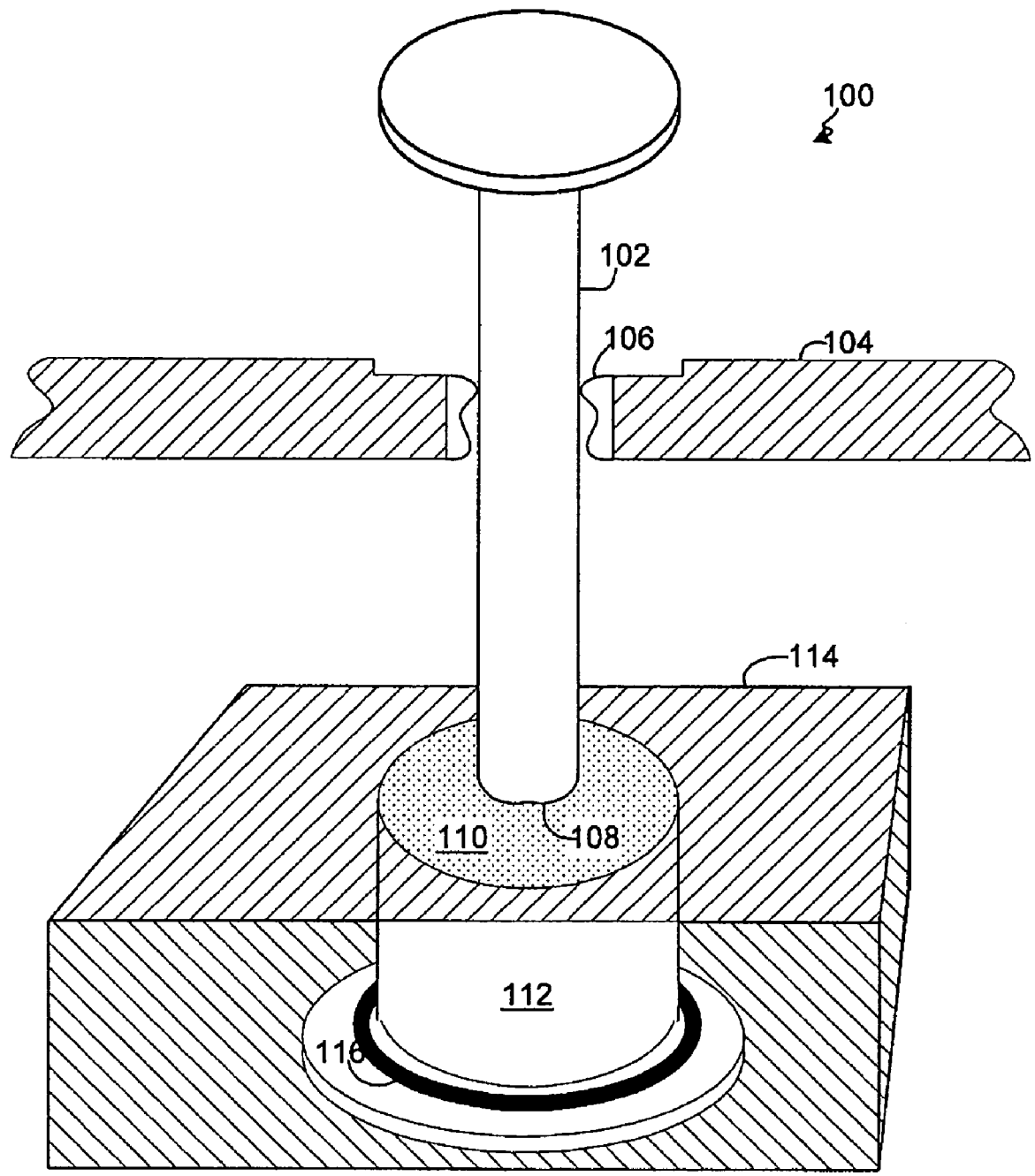
FIG. 1 illustrates a conventional bushing-controlled substrate support.
Figure 2:
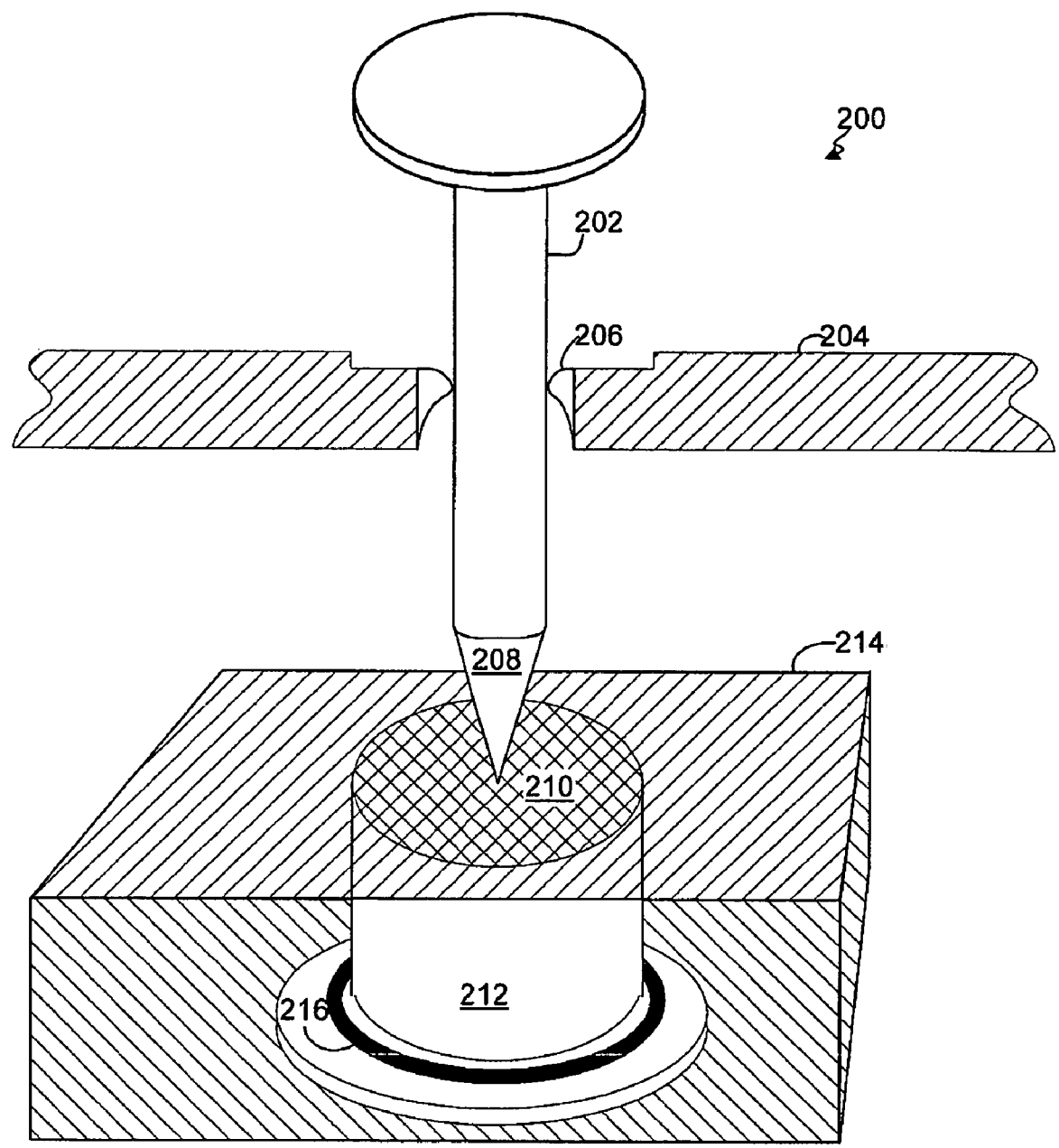
FIG. 2 illustrates a first example embodiment of a substrate support according to the present invention.

Turning to FIG. 2, the present invention provides an improved substrate support 200. In the illustrated embodiment, a lift pin 202 is held in a vertical orientation by a pointed bearing surface 208 (or "point bearing 208") in contact with a friction plate 210 made of ceramic or other suitable material. Note that a bushing 206 mounted in the susceptor 204 is "wide open" or "free" as compared with the "tight" bushing 106 used in the conventional substrate support 100. Also note that in the conventional substrate support 100, the vertical orientation (angle) of the lift pin 102 is maintained or controlled by the tight bushing 106, while in the substrate support 200 of the present invention, the vertical orientation of the lift pin 102 is maintained or controlled primarily by the friction plate 210 engaging the pointed bearing surface 208 at the lower end. It is further noted that, while conventional substrate support 100 may contact the lift pin 102 simultaneously at multiple points, the wide open bushing 206 generally will not.

The friction plate 210 may be mounted on a plug 212 that is inserted into an opening in the bottom wall 214 of a process chamber (not separately shown). The plug 212 may be made from aluminum (or other suitable material) and may include an O-ring 216 or other sealing surface to maintain the seal of the chamber.

Figure 3:
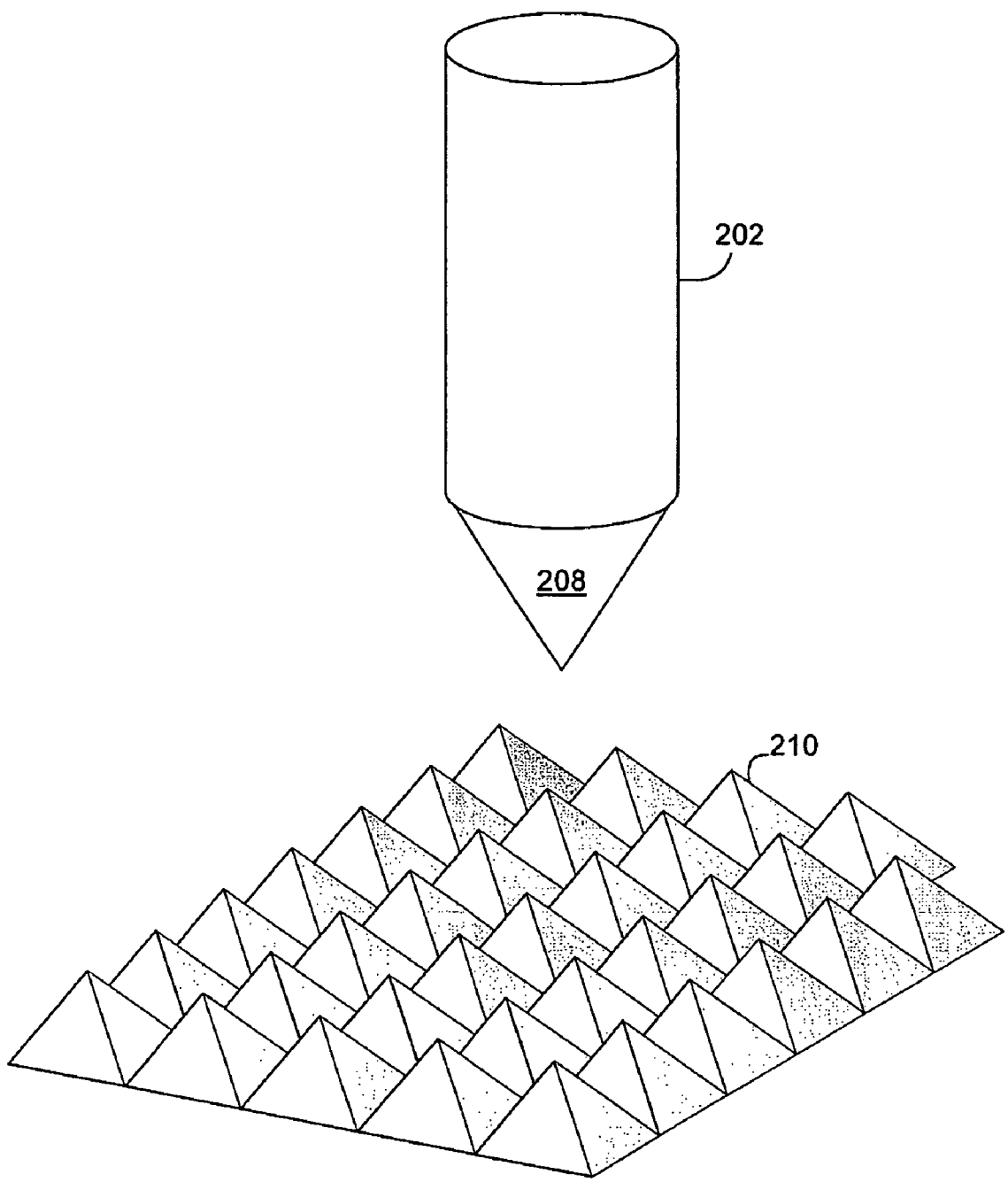
FIG. 3 illustrates a portion of the first example embodiment of a substrate support according to the present invention.

Turning to FIG. 3, details of the pointed bearing surface 208 of the lift pin 202 and a portion of the friction plate 210 are depicted. Although the drawing is not to scale, note that the pointed bearing surface 208 can engage the friction plate 210 by settling into one of the valleys between the pyramid-shaped protrusions on the surface of the friction plate 210. The pyramid-shaped protrusions may be formed on the surface of the friction plate 210, for example, by cutting intersecting rows of V-shaped grooves into the surface of the friction plate 210. In some embodiments, the recesses in the surface of the friction plate 210 may be sized to match the dimensions of the pointed bearing surface 208 of the lift pin 202 such that the two precisely mate when engaged. In some embodiments, other friction plate textures and/or bearing shapes may be used (e.g., to create a high friction interlock upon engagement). For example, the friction plate 210 may include rows of tightly spaced cone-shaped recesses or cylinder-shaped recesses to receive a pointed bearing surface. In some embodiments, the bearing surface may, for example, include an inverted pyramid shape, or a series of inverted pyramid points, to mate with the pyramid-shapes on the friction plate depicted in FIG. 3.

A pyramid friction plate 210 and a pointed bearing surface 208 may accommodate thermal expansion and at the same time ensure that the vertical position of the pin is maintained.

Figure 4:
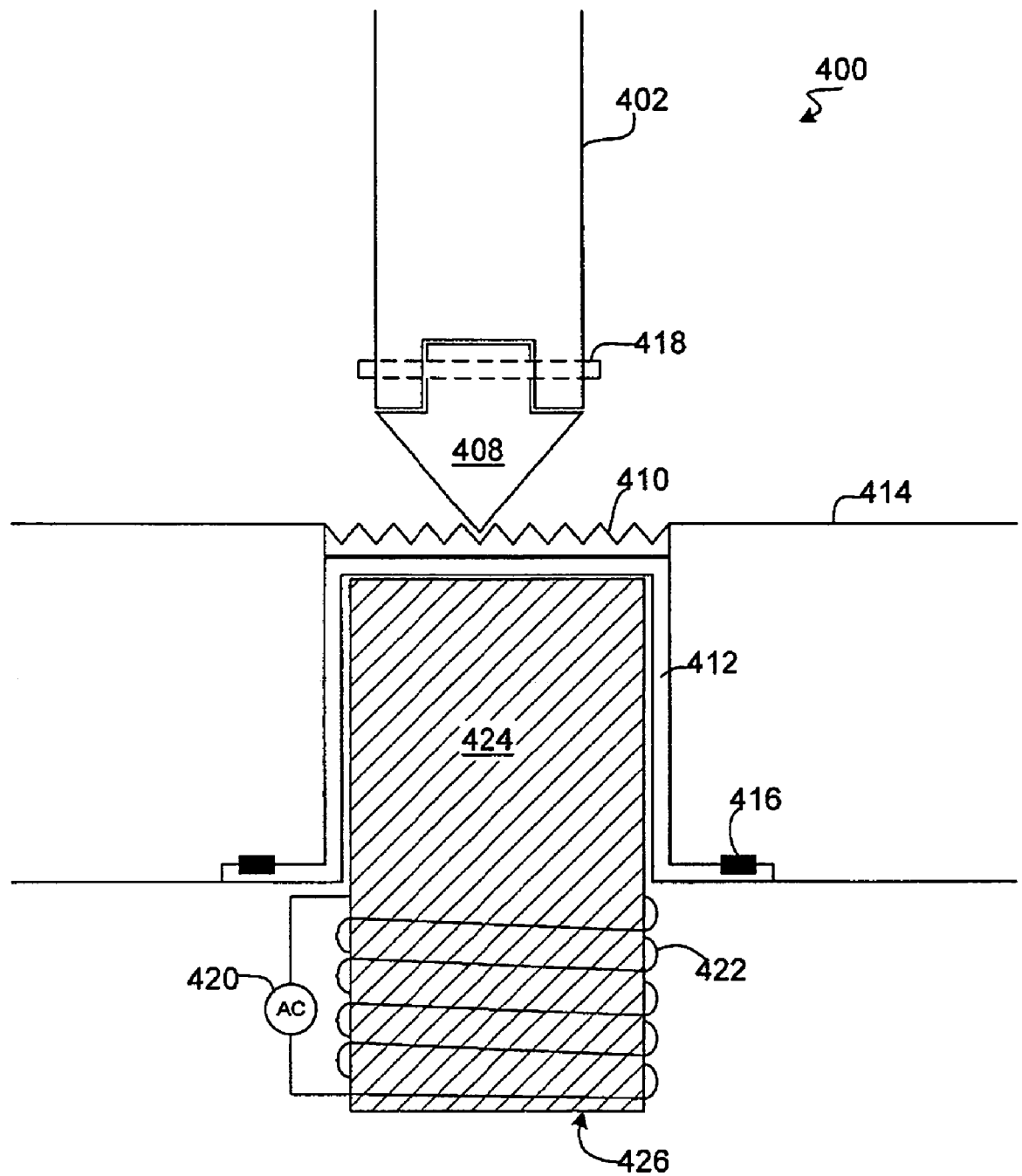
FIG. 4 illustrates a second example embodiment of a substrate support according to the present invention.

Turning to FIG. 4, a second example embodiment of an improved substrate support 400 is depicted. Although not shown, wide open bushings in the susceptor such as those depicted in FIG. 2, may be used with the embodiment depicted in FIG. 4. In such embodiments, a pin 418 or other connecting mechanism may be used to hold a pointed bearing 408 in a recess of a shaft of the lift pin 402. In some embodiments, the pointed bearing 408 may comprise steel coated with aluminum. In general, the pointed bearing 408 may comprise any ferromagnetic material or suitably coated ferromagnetic material.

A ceramic (or other suitable material) friction plate 410 may be mounted on the top of a plug 412 that is inserted into an opening in the bottom wall 414 of a process chamber. Note that the plug 412 may include and O-ring 416 to help seal the chamber. Also note that the plug 412 may be made from aluminum or any suitable material.

An electromagnet 426 formed from, for example, an iron core 424 wrapped with a coil 422 charged by an alternating current source 420, may be inserted into an opening of the plug 412 and may be used to attract the pointed bearing 408. Thus, an electromagnet 426 may be used to vertically align the lift pin 402 as the lift pin approaches the friction plate 410 when the lift pin is lowered along with the susceptor (not shown). The electromagnet 426 may also be used to enhance the engagement between the pointed bearing 408 and the friction plate 410. The stronger the magnetic field, the more the friction between the pin 402 and plate 410. Note that a friction plate 410 like the ones described above with reference to FIG. 3, may be used with the example embodiment depicted in FIG. 4.

Figure 5:
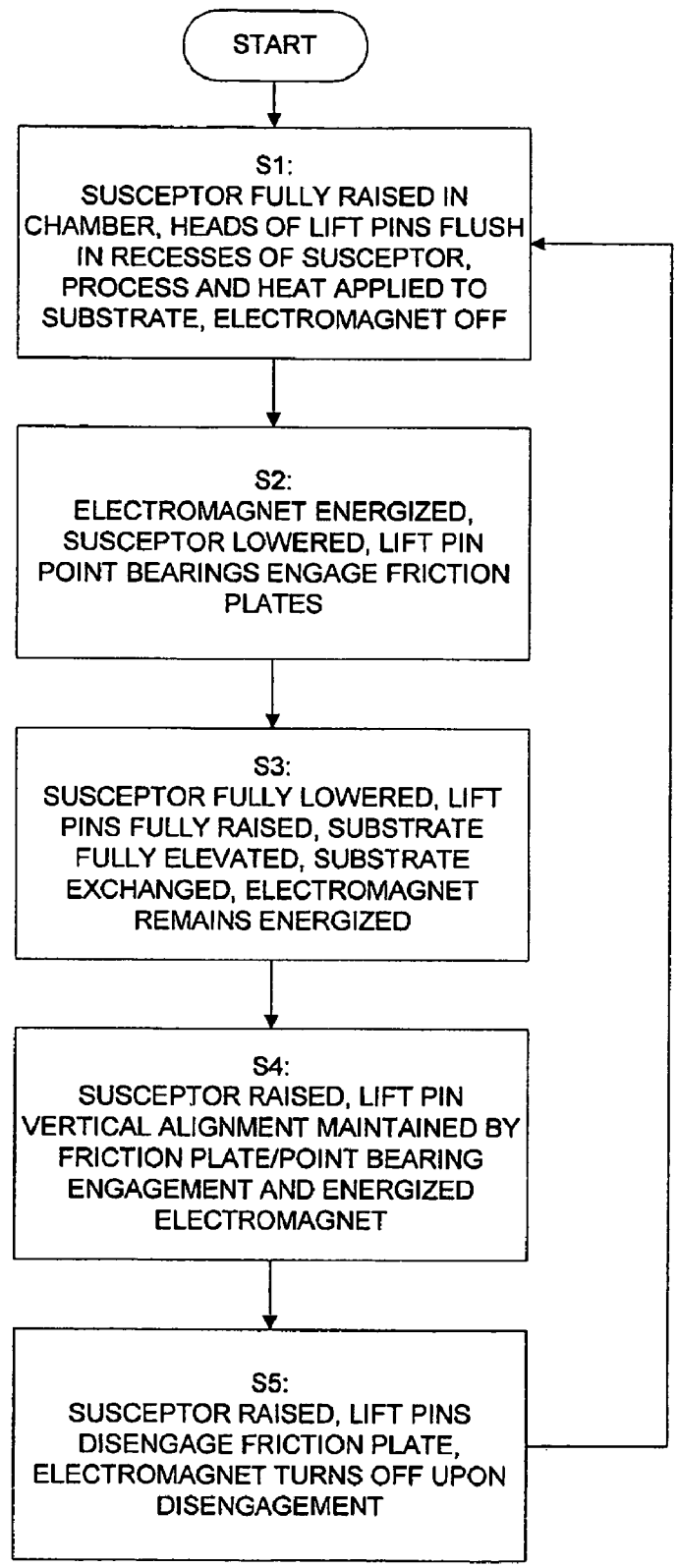
FIG. 5 is a flowchart illustrating an example method according to the present invention.

Turning to FIG. 5, a flowchart depicting an example method of the present invention is provided. In Step S1, the susceptor is fully raised in the process chamber. The heads of lift pins 402 are flush within recesses of the susceptor. Any number of different processes and heating may be applied to the substrate on the susceptor. The electromagnet 426 associated with each lift pin 402 is off.

In Step S2, after the substrate processing is complete, the electromagnets 426 are energized and the susceptor is lowered. As the susceptor is lowered, the lift pin point bearings 408 engage the friction plates 410 mounted on plugs 412 in the bottom of the process chamber. The energized electromagnets 426 create magnetic fields that attract the point bearings 408 of the lift pins 402 and pull the lift pins 402, effectively forcing them to maintain their vertical alignment.

In Step S3, the susceptor is fully lowered and the lift pins 402 are fully raised. The substrate, which is supported by the heads of the lift pins 402, is fully elevated so that a robotic arm or other device may exchange the processed substrate for a new, unprocessed substrate. During the exchange, the electromagnets 426 may remain energized.

In Step S4, after the exchange is complete, the susceptor is raised. While the susceptor is raised and the lift pins 402 are lowered, the lift pin vertical alignment for each lift pin 402 is maintained by the friction plate 410 and point bearing 408 engagement as well as by the energized electromagnet 426.

In Step S5, the susceptor continues to rise and the lift pins 402 disengage the friction plates 410 as the lift pin heads are seated in recesses in the susceptor. The electromagnets 426 turn off upon disengagement to prevent any unintended effects that an electromagnetic field may have upon the substrate processes. Flow continues to Step S1 where the method may repeat.

Figure 6:
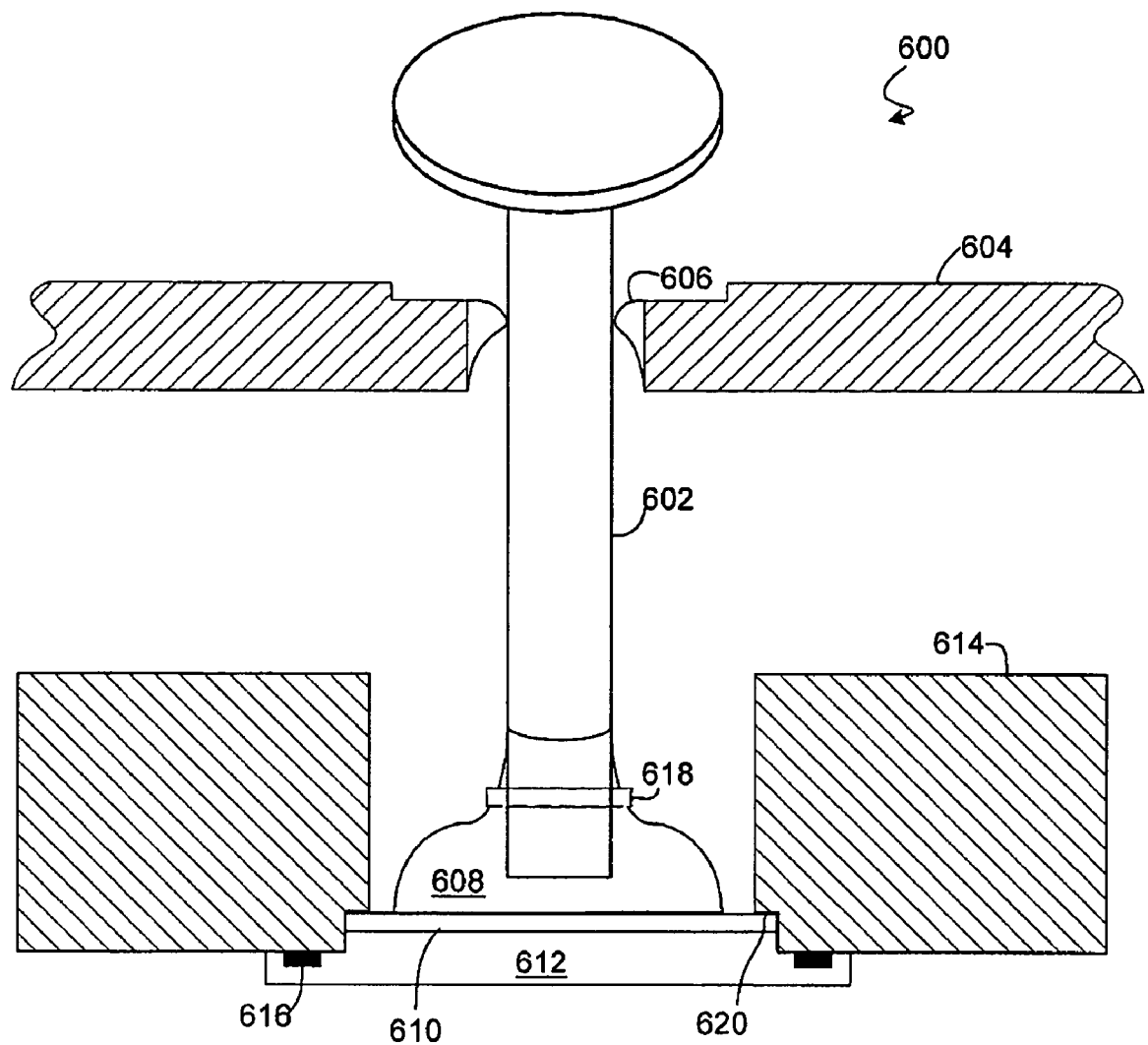
FIG. 6 illustrates a third example embodiment of a substrate support according to the present invention.

In a third embodiment of an improved substrate support 600, a relatively large bearing foot 608 may be attached to the lower end of the lift pin 602 using a pin 618 or other connecting mechanism as depicted in FIG. 6. In some embodiments, the bearing foot 608 may be large enough to maintain the vertical alignment of the lift pin 602 without any horizontal support from the "wide open" or "reduced contact area" bushing 606 in the susceptor 604. The bearing foot 608 may engage a slide plate 610 mounted on a plug 612 filling an opening in the lower wall 614 of the process chamber. The slide plate 610 may be made of ceramic or any other suitable material.

In some embodiments a vertical magnetic field may be applied to the bearing foot 608 and/or lift pin 602 to help maintain the vertical alignment of the lift pin 602. In such embodiments, a bushing 606 may not be used at all. In some embodiments the bushing 606 may be a magnetic bushing that does not contact the lift pin 602, but applies a magnetic field to further help maintain the alignment of the lift pin 602 which may include a ferromagnetic core (not pictured).

In some embodiments, the plug 612, which may be made of aluminum or other suitable material, may not fill the entire opening in the lower wall 614 of the chamber so as to create a recess to receive the bearing foot 608 as depicted in FIG. 6. Note that the plug 612 may include an O-ring 516 or other sealing surface to help seal the chamber. Also note that the opening in the lower wall 614 of the chamber may include a lip 620 on the edge of the opening inside the chamber. In some embodiments, the lip 620 may be used to secure the slide plate 610 to the plug 612.

Figure 7A:
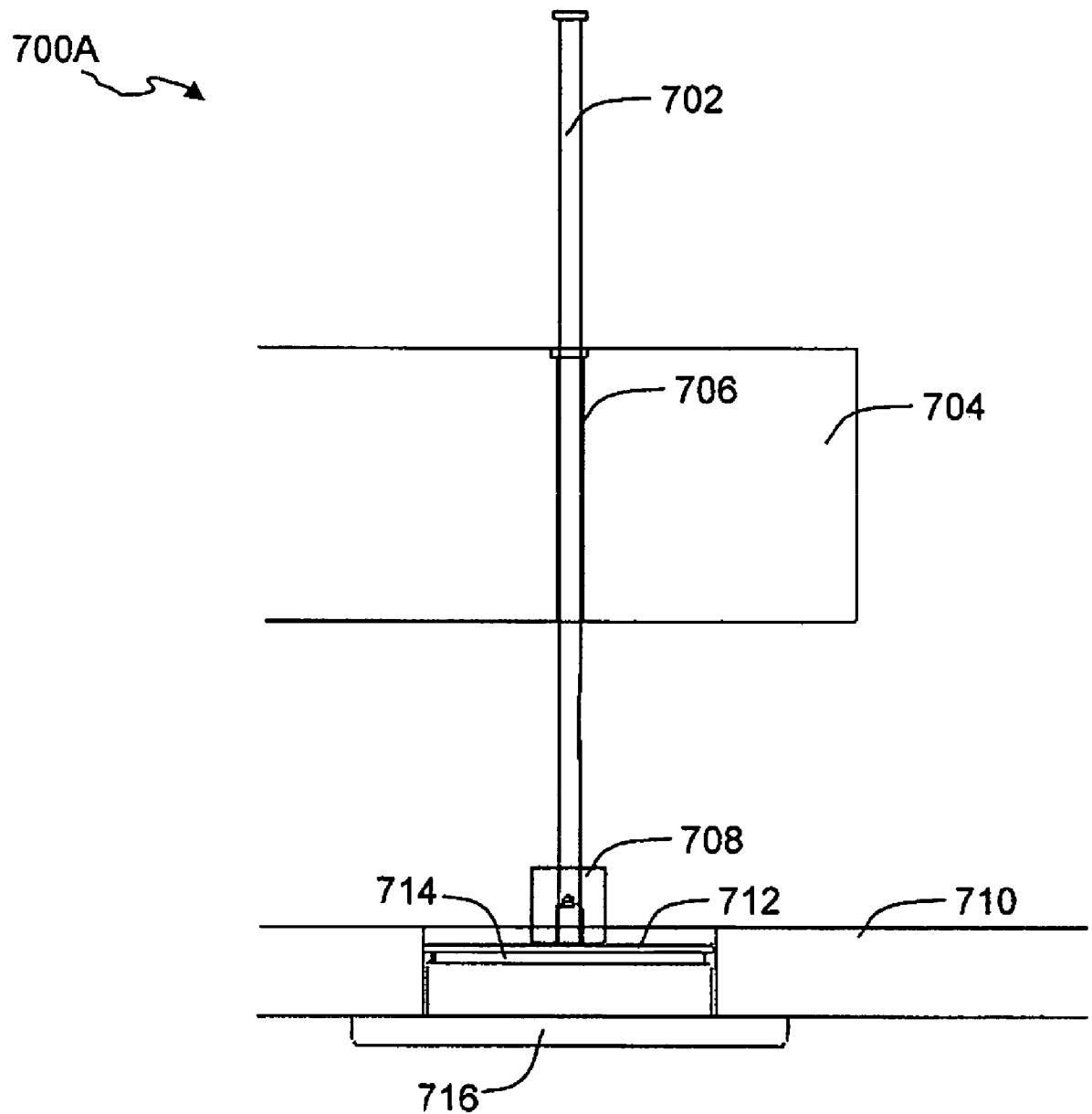
FIGS. 7A and 7B illustrate operation of a fourth example embodiment of a substrate support according to the present invention.
Figure 7B:
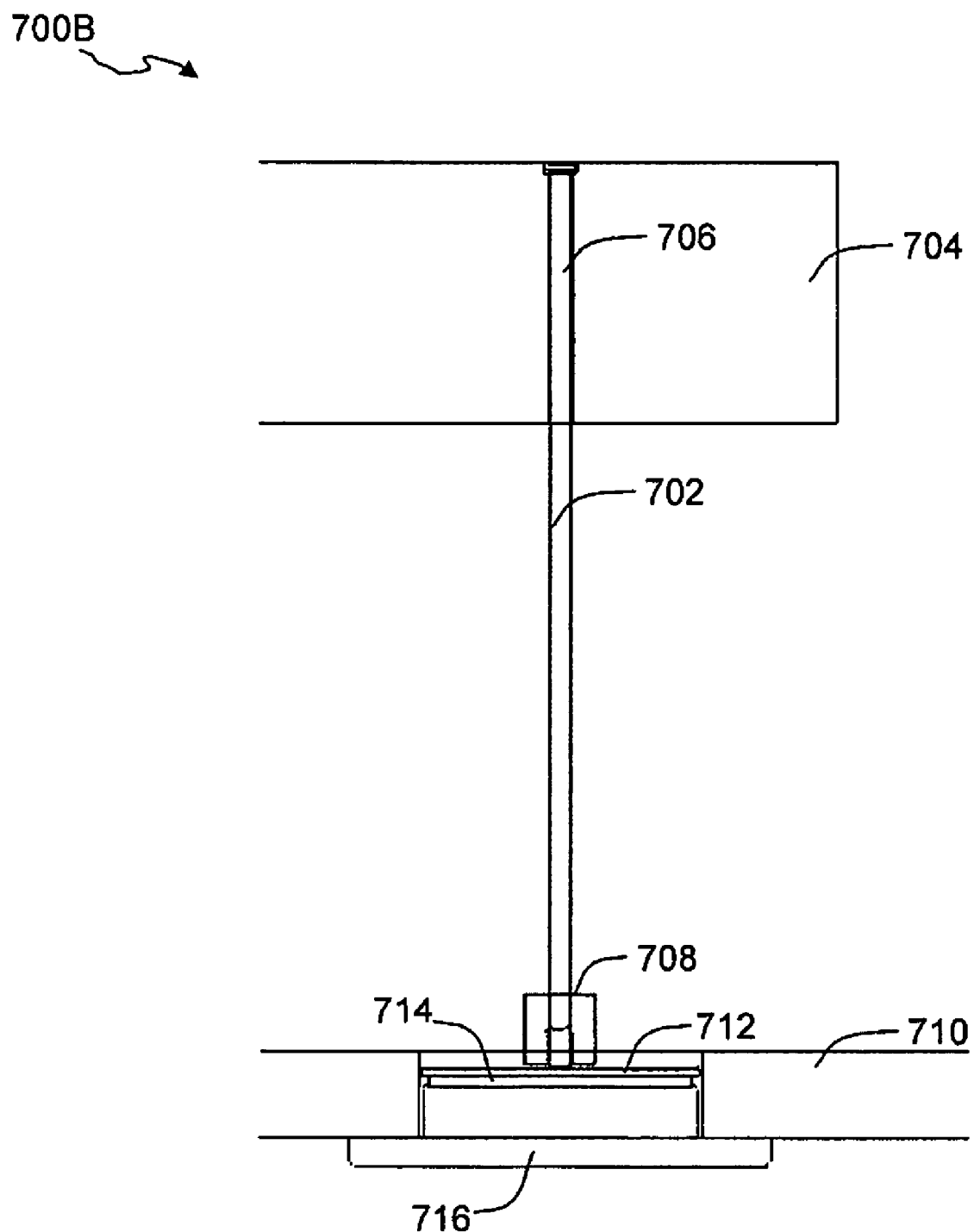

Turning to both FIGS. 7A and 7B, operation of a fourth exemplary embodiment is described. FIG. 7A depicts an embodiment of a substrate support in a raised position 700A and FIG. 7B depicts the same embodiment of the substrate support in a lowered position 700B. In the raised position 700A, the lift pin 702 substrate bearing surface is above the susceptor 704 ready to receive a substrate. As the susceptor 704 is raised, the lift pin 702 remains stationary despite upward forces due to friction from the bushing 706. In accordance with some embodiments of the present invention, a weight and/or permanent magnet 708 attached to the lower end of the lift pin 702 pulls the lift pin 702 downwardly toward the chamber bottom 710 with more force than the upward friction force. Thus, binding of the lift pin 702 in the bushing 706 is avoided and the lift pin 702 does not move up as the susceptor 704 is raised until the top of the lift pin 702 is fully seated into the susceptor 704. Although not pictured, the susceptor 704 may be elevated further such that the lift pin 702 no longer contacts the bottom of the chamber 710.

In some embodiments that use a permanent magnet 708 attached to the lift pin 702, a protective cover 712 and magnetically susceptible plate 714 may be attached to a plug 716 in the chamber bottom 710. The protective cover 712 may be made from ceramic, aluminum, or any suitable inert material. The magnetically susceptible plate 714 may be made from steel or any suitable magnetically susceptible material.

When a substrate is to be removed from the chamber, the susceptor 704 is lowered such that the lift pins 702 once again contact the bottom of the chamber 710 and are ultimately pushed up through the bushings 706. Before contact however, as the lift pin 702 approaches the magnetically susceptible plate 714 when the susceptor is being lowered, the lower end of the lift pin 702 is pulled downward toward the magnetically susceptible plate 714. This pull helps maintain the vertical orientation of the lift pin 702.

It may be preferable to use a magnet in, or attached to, the lift pins in some embodiments as opposed to other embodiments wherein a magnetic field generated by an electromagnet 426 (FIG. 4) acts on magnetically susceptible lift pins 408. This is because a magnetic field may not be uniform over the entire horizontal area that the lift pin 402 may range due to thermal expansion and other forces. In other words, thermal expansion of the susceptor relative to the chamber wall 414 (where the electromagnet 426 is mounted) may affect the vertical orientation of the lift pin 402 since the lift pin 402 will tend to be pulled toward the center of the magnetic field. If the lift pin 402 does not remain precisely over the center of the magnetic field, as is likely given the high probability that there may be a differential thermal expansion between the susceptor lift pin position and the bottom of the chamber, the lift pin 402 may be pulled out of vertical alignment by a horizontal component force of the magnetic field.

By putting a permanent magnet 708 in, or on, the lift pin 702 and not using an electromagnet mounted in the chamber bottom, the magnet 708 will be drawn directly downward towards the magnetically susceptible plate 714 at the point of closest approach. In other words, assuming the magnetically susceptible plate 714 is large enough to cover the horizontal range of the lift pin relative to the chamber bottom, thermal expansion of the susceptor relative to the chamber body (where the magnetically susceptible plate 714 is mounted) will not affect the tendency of the lift pin to be pulled straight downward by the magnetic force of the permanent magnet 708, regardless of the amount of differential thermal expansion that has occurred between the susceptor lift pin position and the bottom of the chamber.

However, in some electromagnet embodiments, a large enough magnetic field may be generated to create sufficient uniformity over the entire horizontal range of the lift pin such that the magnetically susceptible lift pin will not experience any horizontal component force from the magnetic field as it is lowered toward the electromagnet. In some embodiments, the plug in the chamber bottom may include a permanent magnet that creates a magnetic field to attract a magnetically susceptible lift pin. As with the electromagnet embodiment discussed above, it may be preferable to insure that the permanent magnet in the plug creates a field large enough to be substantially uniform over the entire horizontal area in which the lift pin may range due to thermal expansion or other forces.

Figure 8:
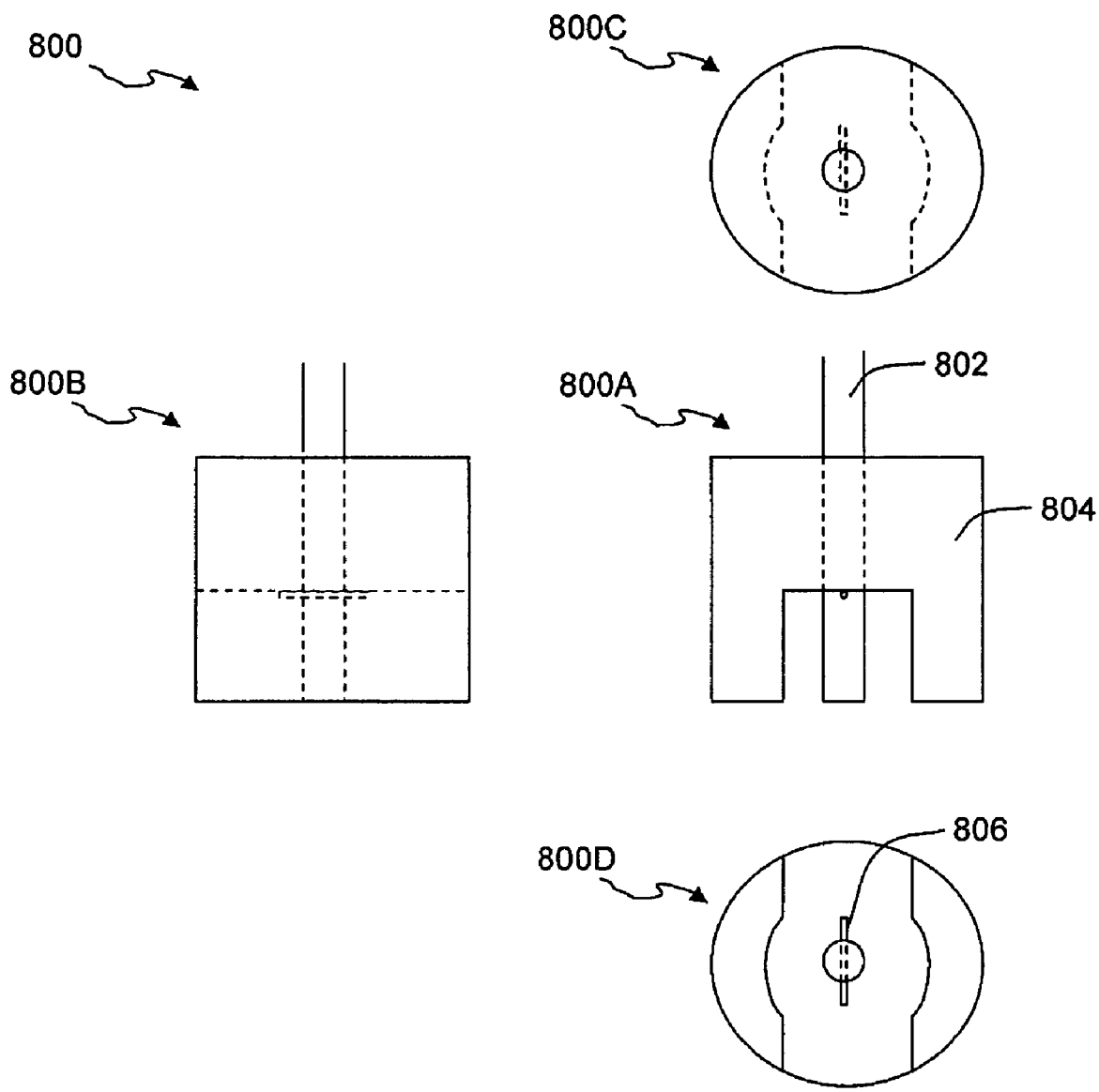
FIG. 8 depicts front, side, top, and bottom detailed views of the fourth example embodiment of a substrate support according to the present invention.

FIG. 8 depicts an illustration of four views 800A, 800B, 800C, 800D of an example embodiment of a substrate support 800 that uses weight and/or permanent magnet 804 attached to a lift pin 802. View 800A is a front view that illustrates the lift pin 802 passes through the center of an inverted "U"-shaped weight and/or permanent magnet 804. Thus, as depicted, in some embodiments a "horseshoe" shaped magnet maybe used. View 800B is a side view that illustrates the weight and/or permanent magnet 804 rotated ninety degrees from the front view 800A. View 800C is a top view and view 800D is a bottom view that illustrates a pin 806 through the lift pin 802 that may be used to secure the weight and/or permanent magnet 804 to the lift pin 802. Any suitable method of attaching the weight and/or permanent magnet 804 to the lift pin 802 may be used.

In some embodiments, a weight may be sufficient to overcome any friction that may cause the shaft of a lift pin 702 (FIG. 7A) to bind-up or otherwise get stuck in a straight-bore bushing 706 of a susceptor 704. In some embodiments where it may be desirable to avoid any possibility of the shaft of the lift pin 702 binding-up in the bushing 706, a permanent magnet, such as one made of neodymium, iron, and boron (NIB); aluminum, nickel, and cobalt (Alnico); and/or cobalt and samarium (C-S), that has the benefit of both gravitational and magnetic forces pulling directly downward, may be employed.

In some embodiments, a bushing with a tapered bore or other profile may be used. A tapered bore may include an expanded inner diameter down the length of the bushing to further reduce the likelihood of the lift pin binding. In such embodiments, methods described herein that maintain the vertical orientation of the lift pin may be employed as practicable.

Figure 9:
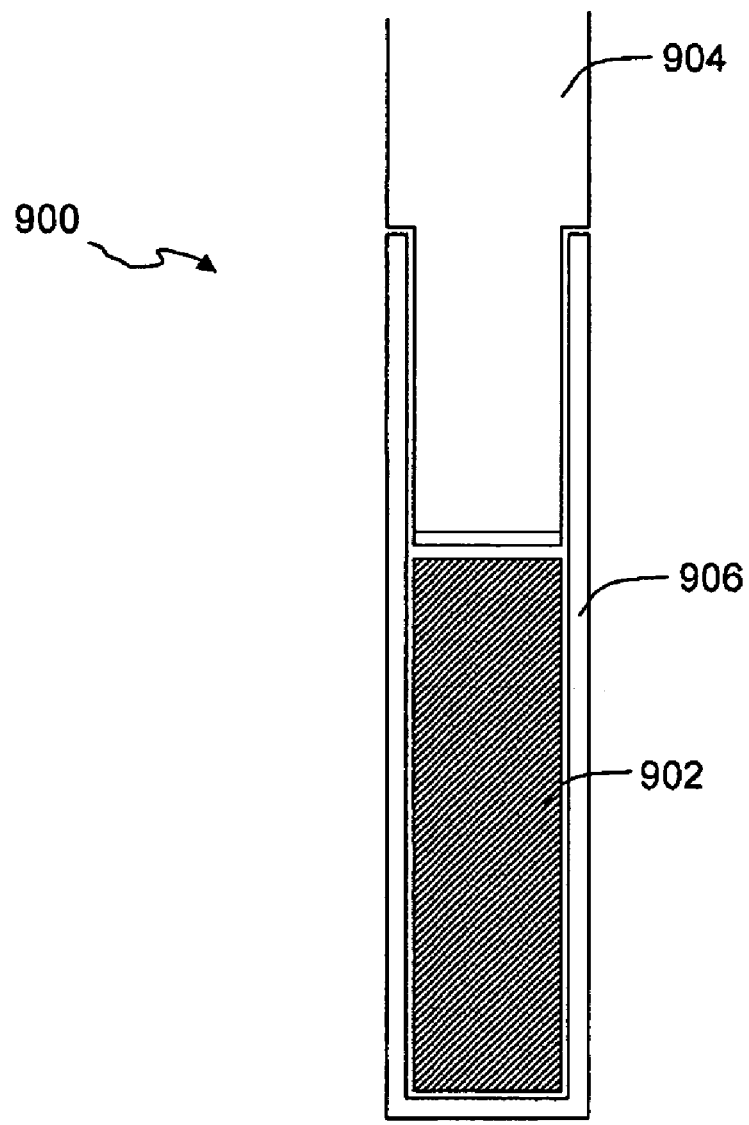
FIG. 9 illustrates a fifth example embodiment of a substrate support according to the present invention.

Turning to FIG. 9, an example embodiment of a substrate support 900 that uses weight and/or permanent magnet 902 encapsulated in a lift pin 904 is depicted. In some embodiments, the weight and/or permanent magnet 902 may be held in a cap 906 that attaches to the end of a lift pin 904. Although not pictured, in some embodiments, the cap 906 may attach to the lift pin 904 using a pin through both the cap 906 and the lift pin 904. In some embodiments, the inside of the cap 906 may include threads that match threading on the end of the lift pin 904 such that the cap 906 may simply be screwed onto the end of the lift pin 904. Other suitable methods of attaching the cap 906 to the lift pin 904 may be employed. In some embodiments the cap 906 may be made from aluminum, ceramic, or other suitable inert material. In operation, a lift pin 904 with an encapsulated weight and/or permanent magnet 902 may function in the same manner as described above with regard to the weight and/or permanent magnet 708 attached to the lift pin 702.

Accordingly, while the present invention has been disclosed in connection with exemplary embodiments thereof, it should be understood that other embodiments may fall within the spirit and scope of the invention, as defined by the following claims.

What is claimed is:

1. An apparatus for handling substrates with electronic components comprising:
   a stationary plate;
   at least one lift pin having a first end adapted to lift a first substrate to allow clearance for a robotic arm between a bottom of the first substrate and a susceptor to exchange the first substrate for a second substrate, and a second end opposite the first end adapted to engage the plate while the substrate is lifted by the pin, wherein the lift pin is disposed to slide vertically through the susceptor; and
   a magnet coupled to the lift pin, wherein the magnet is disposed to apply an attracting force to maintain a vertical orientation of the lift pin.

2. The apparatus of claim 1 wherein the magnet is disposed to prevent the lift pin from binding to the susceptor.

3. The apparatus of claim 1 wherein the magnet is coupled to a lower end of the lift pin.

4. The apparatus of claim 1 wherein the magnet is a permanent magnet.

5. The apparatus of claim 1 further including a bushing disposed in the susceptor to guide the at least one lift pin.

6. The apparatus of claim 5 wherein the bushing includes a straight bore.

7. The apparatus of claim 5 wherein the bushing includes a tapered bore.

8. An apparatus comprising:
   a lift pin having a first end adapted to support a substrate and a lower bearing surface opposite the first end;
   a plate adapted to engage the lower bearing surface, wherein a vertical orientation of the lift pin may be maintained during lifting of the substrate by the lower bearing surface engaging the plate; and a magnetic field generation source adapted to apply a magnetic field to the lift pin and wherein the lift pin includes a magnetically susceptible material.

9. An apparatus comprising:
   a lift pin having a first end adapted to support a substrate and a lower bearing surface opposite the first end;
   a stationary plate adapted to engage the lower bearing surface, wherein a vertical orientation of the lift pin may be maintained during lifting of the substrate by the lower bearing surface engaging the plate; and
   a magnet coupled to the lift pin.

* * * * *